(12) United States Patent
Tanzawa

(10) Patent No.: US 8,853,778 B2
(45) Date of Patent: Oct. 7, 2014

(54) DEVICES FOR SHIELDING A SIGNAL LINE OVER AN ACTIVE REGION

(75) Inventor: Toru Tanzawa, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/595,454

(22) Filed: Aug. 27, 2012

(65) Prior Publication Data

US 2012/0319184 A1    Dec. 20, 2012

Related U.S. Application Data

(63) Continuation of application No. 12/512,579, filed on Jul. 30, 2009, now Pat. No. 8,253,198.

(51) Int. Cl.
| | |
|---|---|
| *H01L 29/772* | (2006.01) |
| *H01L 29/423* | (2006.01) |
| *H01L 23/522* | (2006.01) |
| *H01L 29/78* | (2006.01) |

(52) U.S. Cl.
CPC ........ *H01L 23/5225* (2013.01); *H01L 29/4238* (2013.01); *H01L 29/78* (2013.01)
USPC ..................... 257/340; 257/630; 257/E29.268

(58) Field of Classification Search
CPC ..................... H01L 29/42376; H01L 23/5225; H01L 29/4238
USPC .................................. 257/340, 630, E29.268
See application file for complete search history.

(56) References Cited

U.S. PATENT DOCUMENTS

| | | | |
|---|---|---|---|
| 5,567,965 A | 10/1996 | Kim | |
| 5,866,460 A | 2/1999 | Akram et al. | |
| 6,297,108 B1 | 10/2001 | Chu | |
| 6,355,955 B1 | 3/2002 | Gardner et al. | |
| 6,528,848 B1 | 3/2003 | Hoshino et al. | |
| 7,101,764 B2 | 9/2006 | Petti | |
| 7,196,375 B2 | 3/2007 | Chen et al. | |
| 7,259,432 B2 | 8/2007 | Tamaru | |
| 7,428,026 B2 | 9/2008 | Oh et al. | |
| 7,436,035 B2 | 10/2008 | Murthy et al. | |
| 7,525,150 B2 | 4/2009 | Chen et al. | |
| 7,576,382 B2* | 8/2009 | Ueno | 257/306 |
| 2003/0052352 A1* | 3/2003 | Soeda | 257/296 |
| 2004/0021175 A1* | 2/2004 | Brech | 257/340 |
| 2006/0163626 A1 | 7/2006 | Chen et al. | |
| 2006/0192288 A1* | 8/2006 | Ueno | 257/758 |
| 2008/0028521 A1 | 2/2008 | Mehta | |
| 2008/0042236 A1 | 2/2008 | Seah Teo Leng | |
| 2008/0308862 A1 | 12/2008 | Theeuwen et al. | |
| 2009/0026539 A1 | 1/2009 | Birner et al. | |
| 2010/0163979 A1 | 7/2010 | Hebert | |

* cited by examiner

*Primary Examiner* — Steven J Fulk
(74) *Attorney, Agent, or Firm* — TraskBritt

(57) ABSTRACT

A multi-path transistor includes an active region including a channel region and an impurity region. A gate is dielectrically separated from the channel region. A signal line is dielectrically separated from the impurity region. A conductive shield is disposed between, and dielectrically separated from, the signal line and the channel region. In some multi-path transistors, the channel region includes an extension-channel region under the conductive shield and the multi-path transistor includes different conduction paths, at least one of the different conduction paths being in the extension-channel region to conduct substantially independent of a voltage on the signal line. In other multi-path transistors, the conductive shield is operably coupled to the impurity region and the multi-path transistor includes different conduction paths, at least one of the different conduction paths being under the conductive shield to conduct substantially independent of a voltage on the signal line.

19 Claims, 9 Drawing Sheets

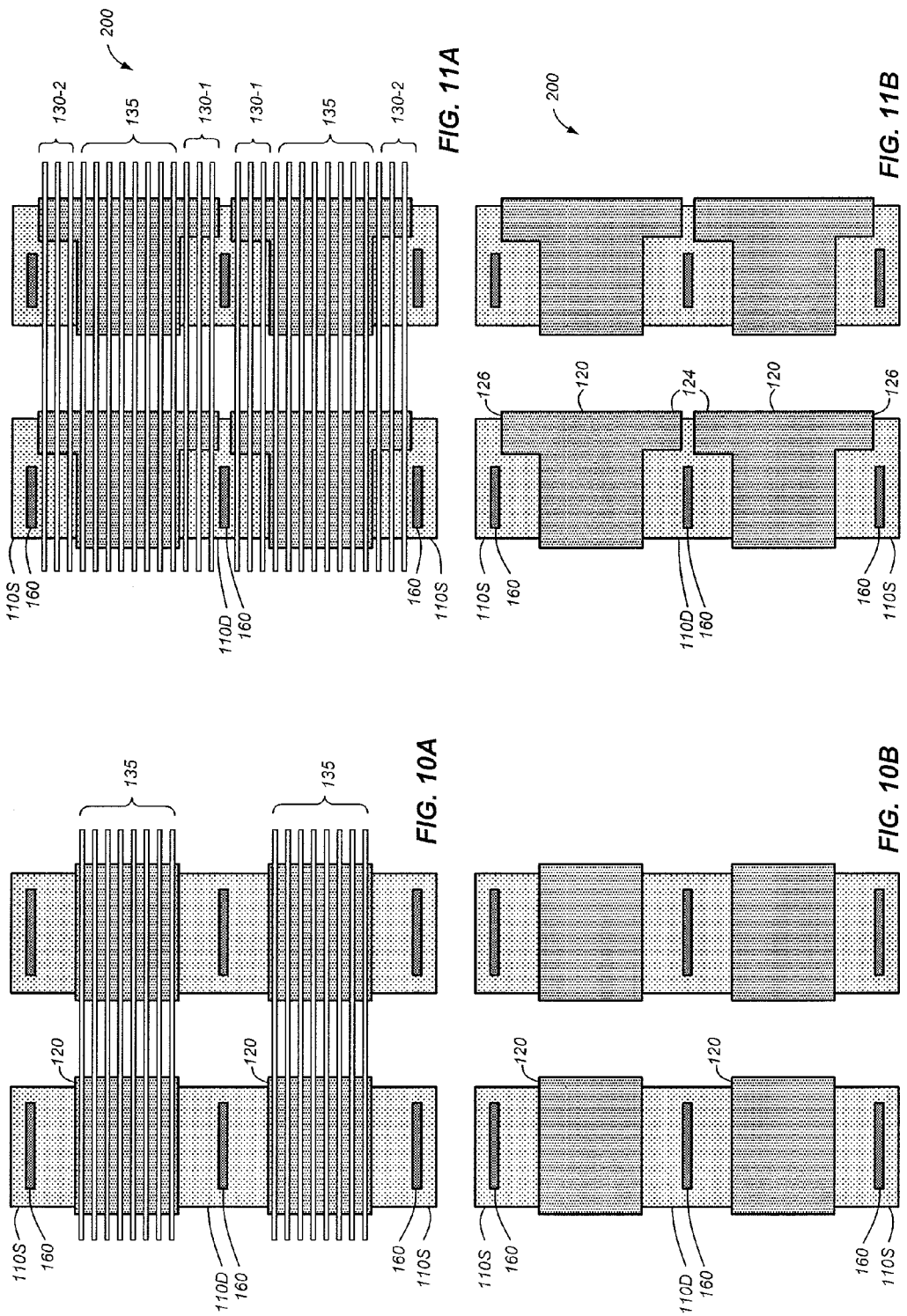

DEVICES FOR SHIELDING A SIGNAL LINE OVER AN ACTIVE REGION

CROSS-REFERENCE TO RELATED APPLICATION

This application is a continuation of U.S. patent application Ser. No. 12/512,579, filed Jul. 30, 2009, now U.S. Pat. No. 8,253,198, issued Aug. 28, 2012, the disclosure of which is hereby incorporated herein in its entirely by this reference.

FIELD OF THE INVENTION

Embodiments of the present disclosure relate to semiconductor devices and, more particularly, to shielding of signal lines disposed over an active region in semiconductor devices.

BACKGROUND

Semiconductor device features become smaller and smaller as design and fabrication techniques for the semiconductor devices improve. As feature sizes get smaller, in some semiconductor devices, signal routing densities may be more important to die size than transistor densities.

In addition, signals generally cannot be routed over some portions of a semiconductor device. Some areas of a semiconductor device may be safe for signal routing and some areas of a semiconductor device may not be safe for signal routing. In some devices, signals that are unrelated to the operation of a particular transistor are not routed over the active region of that transistor because the signals may influence normal operation of that transistor. In other cases, signals may be routed above active regions of transistors but at a height above the transistors, with sufficient dielectric material between the signal and the active region, such that any capacitive coupling between the signal and the active regions has a negligible effect on transistor operation.

Thus, devices with high signal routing densities, such as, for example, devices with repeatable arrays, may require an increased die size due to the signal routing requirements discussed above. In other words, while die size might be reduced if only the transistor densities were considered, in practice die size grows simply to accommodate the necessary signal routing.

The inventor has appreciated that there is a need for ways to improve signal routing options relative to device densities in an effort to reduce real estate consumed on a semiconductor device for a given function.

BRIEF DESCRIPTION OF THE DRAWINGS

In the drawings, which illustrate embodiments of the invention:

FIGS. 10A and 10B are layout diagrams of arrayed devices showing possible signal line routing over conventional FETs;

FIGS. 11A and 11B are layout diagrams of arrayed devices showing possible signal line routing over FETs according to one or more embodiments of the present invention.

DETAILED DESCRIPTION

Figure 1A:
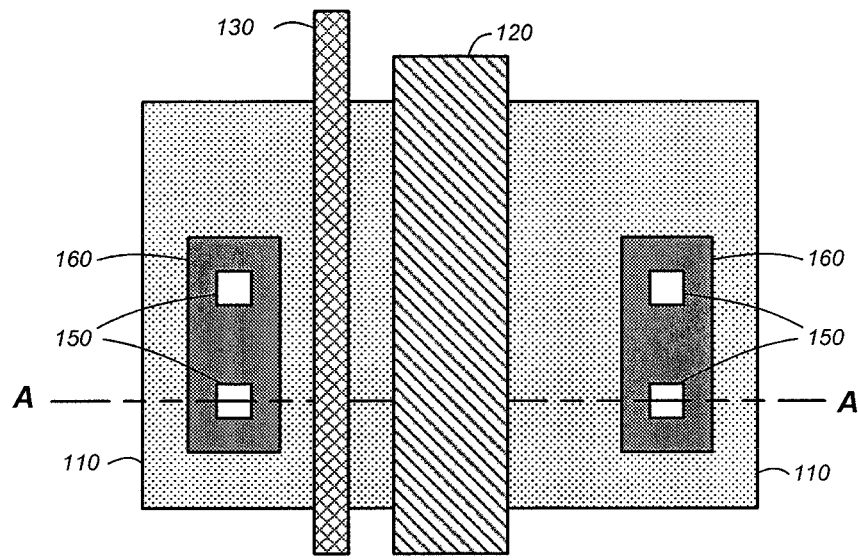
FIG. 1A is a layout diagram of a conventional Field-Effect Transistor (FET) and a signal line.

In the following detailed description, reference is made to the accompanying drawings which form a part hereof, and in which is shown by way of illustration specific embodiments in which the invention may be practiced. These embodiments are described in sufficient detail to enable those of ordinary skill in the art to practice the invention, and it is to be understood that other embodiments may be utilized, and that structural, logical, and electrical changes may be made within the scope of the present invention.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus (e.g., device) or method. In addition, like reference numerals may be used to denote like features throughout the specification and figures.

In this description, circuits and functions may be shown in block diagram form in order not to obscure the present invention in unnecessary detail. Furthermore, specific circuit implementations shown and described are only examples and should not be construed as the only way to implement the present invention unless specified otherwise herein. Block definitions and partitioning of logic between various blocks represent a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but may be based on silicon-germanium, silicon-on-insulator, silicon-on-sapphire, germanium, or gallium arsenide, among others.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise, a set of elements or an array of elements may comprise one or more elements.

Embodiments disclosed herein include methods and devices that use shielding between signal lines and active regions, such as to improve signal routing options over active regions of a semiconductor device.

Figure 1B:
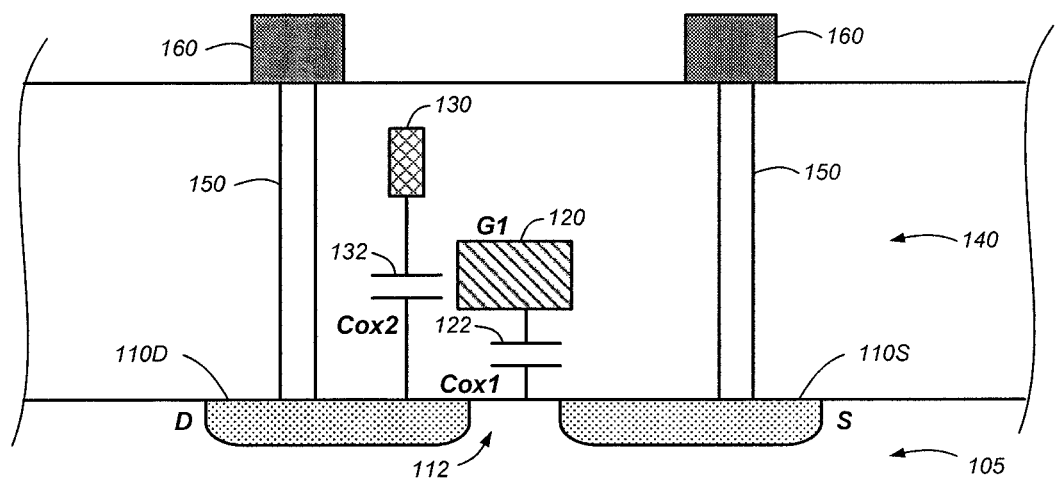
FIG. 1B is a cross-sectional view of the FET and signal line of FIG. 1A along section line A-A.

FIG. 1A is a layout diagram of a conventional Field-Effect Transistor (FET) and a signal line 130. FIG. 1B is a cross-sectional view of the FET and signal line 130 of FIG. 1A along section line A-A. The FET may be formed on or over a substrate 105 and includes a source 110S, a drain 110D, a gate 120, and a channel 112 under the gate 120 and between the source 110S and the drain 110D. The source 110S and drain 110D may be referred to generically as impurity regions 110 and the area encompassing the source region 110S, the drain region 110D, and the channel 112 may be referred to as an active region. In the drawings, the drain is also designated with "D," the source is also designated with "S," and the gate is also designated with "G1."

A dielectric layer 140 (also referred to herein as dielectric material 140) is generally shown between and dielectrically separating the substrate 105 and an upper routing layer containing signal lines 160. Of course, this dielectric layer 140 may be formed of multiple layers of dielectric material(s) to allow formation of intermediate layers, such as, for example, a gate oxide layer under the gate 120, a layer for the signal line 130, and a layer separating (or at least partially separating) the signal lines 160 from the substrate 105. The signal lines 160 may be connected to locations of the source region 110S and drain region 110D through one or more vias 150.

A capacitive coupling 122 (also designated as Cox1 in the drawings) exists between the gate 120 and the channel 112 (with at least a portion of the dielectric material 140 therebetween). In addition, a second capacitive coupling 132 (also designated as Cox2 in the drawings) exists between the signal line 130 and the drain 110D (with at least a portion of the dielectric material 140 therebetween). The signal line 130 generally carries a signal that is unrelated to the operation of the FET (e.g., it may be carrying a signal related to the operation of another FET).

Of course, the FET may be formed as a p-channel device or as an n-channel device using conventional processing methods and conventional impurity dopants for forming the impurity regions 110 of the source 110S and the drain 110D. Without limiting, and for convenience of discussion, for the most part the FETs discussed herein will be described as n-channel devices. A person of ordinary skill in the art will be able to translate the discussion of structure and operation of an n-channel device to a p-channel device.

In operation of a conventional FET configured without the signal line 130, when there is a sufficiently high drain-to-source voltage and a sufficiently high gate-to-source voltage, the FET will conduct (i.e., the FET is in an "on" condition) with a current $I_{ds}$ through the channel 112 between the source 110S and the drain 110D. The capacitive coupling 122 of a relatively high voltage on the gate 120 to the channel 112 creates an inversion layer of carriers enabling the conduction. Conversely, a relatively low voltage on the gate 120 capacitively couples to the channel 112 to disperse the carriers and substantially prevent the current $I_{ds}$ (i.e., the FET is in an "off" condition).

In a similar fashion, a voltage on the signal line 130 can vary carrier concentrations in the drain 110D through the second capacitive coupling 132. For example, for an n-channel transistor, if the voltage on the signal line 130 is near zero or negative, the second capacitive coupling 132 can cause the electron concentration in the drain 110D near the channel 112 to be so low that a portion of the drain 110D can be cut off, impeding (e.g., preventing or substantially reducing) the current $I_{ds}$ even when the FET would normally be on due to the voltage on the gate 120.

While this cut-off effect from the signal line 130 may be experienced with any type of FET, it may be more pronounced with high voltage FETs. Many modern semiconductor devices include both low voltage transistors and high voltage transistors. As a non-limiting example, high voltages may be needed to program non-volatile memory cells, as well as other functions. A high voltage transistor has a high breakdown voltage. In order to achieve this high breakdown voltage, high voltage transistors may be fabricated differently from low voltage transistors by varying parameters such as gate oxide thickness, channel length, and doping concentrations for the impurity regions. Lightly Doped Drains (LDD) are often used in high voltage transistors. Even though described as lightly doped "drains," the term may also refer to source impurity regions.

With lightly doped drains the carrier concentration (e.g., electrons for n-channel devices) is lower in the impurity regions. As a result, the second capacitive coupling 132 due to the signal line 130 may cause a large tendency to cut off current in the FET because there is a smaller concentration of carriers in the impurity region 110.

As a non-limiting example, perhaps a high voltage n-channel transistor is capable of a drain-to-source voltage of 20 volts and the transistor has a threshold voltage of 3 volts or less. With no influence from the signal line 130, a gate voltage of 20 volts would turn the device on to conduct current from the drain 110D to the source 110S (i.e., conduct electron carriers from the source 110S to the drain 110D).

However, when the signal line 130 has a voltage near 0 volts, the second capacitive coupling 132 can cut off electron carriers in the drain 110D underneath the signal line 130 impeding a conduction path between the source 110S and the drain 110D. This cut-off may be experienced even when the voltage on the gate 120 is raised above the voltage on the drain 110D. As a non-limiting example, even with a gate voltage of 24 volts, the transistor may still be in an off state.

However, as the voltage on the signal line 130 rises, its influence on the transistor diminishes and the transistor will begin to conduct. For example, if the voltage on the signal line 130 is at 20 volts, the transistor will easily conduct when the gate voltage is also 20 volts.

As stated earlier, this cut-off effect from the signal line 130 routed over an impurity region 110 may be experienced in any type of transistor with the proper combination of magnitude of second capacitive coupling 132, voltage on the impurity region 110, and voltage on the signal line 130. The effect just may be more pronounced for high voltage transistors with lightly doped drains.

Figure 2A:
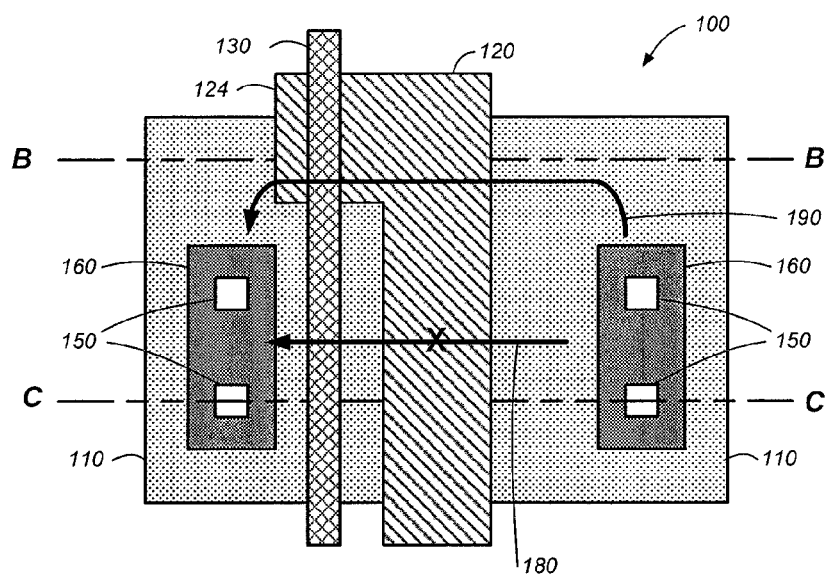
FIG. 2A is a layout diagram of a signal line and FET according to one or more embodiments of the present invention showing a gate with a gate extension.
Figure 2B:
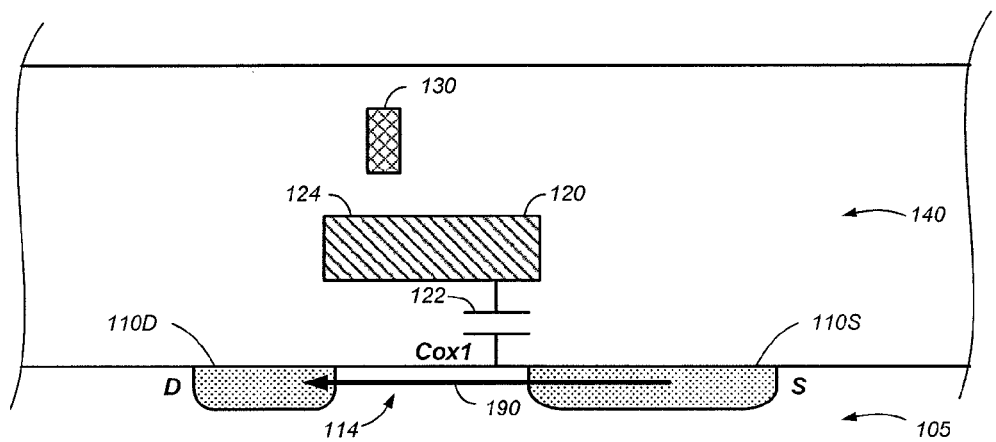
FIG. 2B is a cross-sectional view of the FET and signal line of FIG. 2A along section line B-B.
Figure 2C:
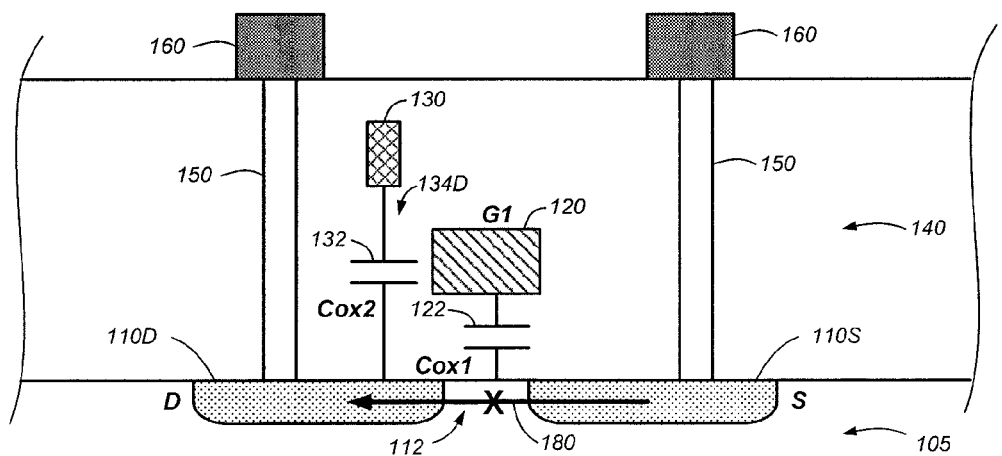
FIG. 2C is another cross-sectional view of the FET and signal line of FIG. 2A along section line C-C.

FIG. 2A is a layout diagram of a signal line 130 and FET according to one or more embodiments of the present invention showing a gate 120 with a gate extension 124 (the gate extension 124 may also be referred to herein as a conductive shield). FIG. 2B is a cross-sectional view of the FET and signal line 130 of FIG. 2A along section line B-B. FIG. 2C is another cross-sectional view of the FET and signal line 130 of FIG. 2A along section line C-C. The FETs according to one or more embodiments of the present invention are referred to herein as multi-path transistors 100. Thus, the multi-path transistor 100 of FIGS. 2A-2C is similar to the conventional FET of FIGS. 1A and 1B except that the multi-path transistor 100 includes the gate extension 124 as part of the gate 120.

The multi-path transistor 100 may be formed in or over a substrate 105 and includes a source 110S, a drain 110D, a gate 120, and a channel 112 under the gate 120 and between the source 110S and the drain 110D. The source 110S may also be referred to herein as a source region 110S, a source portion 110S, or a source side 110S. Similarly, the drain 110D may also be referred to herein as a drain region 110D, a drain portion 110D, or a drain side 110D. In addition, the source region 110S and drain region 110D may be referred to generically as impurity regions 110 and the area encompassing the source region 110S, the drain region 110D, and the channel 112 may be referred to as an active region. In the drawings, the drain is also designated with "D," the source is also designated with "S," and the gate is also designated with "G1."

A dielectric layer 140 (also referred to herein as dielectric material 140) is generally shown between and dielectrically separating the substrate 105 and an upper routing layer containing signal lines 160. Of course, this dielectric layer 140 may be formed of multiple layers of dielectric material(s), which may be of the same or different compositions, to allow formation of intermediate layers, such as, for example, a gate oxide layer under the gate 120, a layer for the signal line 130, and a layer for the signal routing 160. The signal routings 160 may be connected to locations of the source region 110S and drain region 110D through one or more vias 150.

A capacitive coupling 122 (also designated as Cox1 in the drawings) exists between the gate 120 and the channel 112 (with at least a portion of the dielectric material 140 therebetween). In addition, a second capacitive coupling 132 (also designated as Cox2 in the drawings) exists between the signal line 130 and the drain 110D (with at least a portion of the dielectric material 140 therebetween). The signal line 130 generally carries a signal that is unrelated to the operation of the multi-path transistor 100. In addition, while the signal line 130 is shown in between the gate 120 and the signal lines 160, it will be understood that the signal line 130 may be anywhere in the stack, with the second capacitive coupling 132 increasing as the distance between the signal line 130 and the impurity region 110D decreases.

Of course, the multi-path transistor 100 may be formed as a p-channel device or as an n-channel device using conventional processing methods and conventional impurity dopants for farming the impurity regions 110 of the source 110S and the drain 110D. Without limiting, and for convenience of discussion, for the most part the multi-path transistors 100 discussed herein will be described as n-channel devices. A person of ordinary skill in the art will be able to translate the discussion of structure and operation of an n-channel device to a p-channel device.

The multi-path transistor 100 also includes a gate extension 124 which is formed as a part of the gate 120 and extends underneath a portion of the signal line 130. The area between the signal line 130 and the drain 110D is referred to herein as a drain-overlap region 134D. Thus, the gate extension 124 occupies a portion of this drain-overlap region 134D and is dielectrically disposed between, and dielectrically separated from, the signal line 130 and an extension-channel region 114 (e.g., due to the one or more layers of dielectric material 140).

FIG. 2B is a cross-sectional view of the multi-path transistor 100 and the signal line 130 along section line B-B through the gate extension 124. For the portion of the drain-overlap region 134D occupied by the gate extension 124, the second capacitive coupling 132 is substantially broken. As a result, two different conduction paths are formed for the multi-path transistor 100. A first conduction path 180 exists where there is no gate extension 124 and behaves as described above for FIGS. 1A and 1B. A second conduction path 190 is formed in an extension-channel region 114 between the source 110S and the drain 110D under the gate extension 124.

On the second conduction path 190, the second capacitive coupling 132 is substantially broken so voltage changes on the signal line 130 are substantially shielded from the drain 110D and will have minimal effect on the second conduction path 190. Thus, the second conduction path 190 portion of the multi-path transistor 100 conducts with proper values for gate-to-source voltages, gate-to-drain voltages, and source-to-drain voltages in a normal manner substantially independent from the voltage on the signal line 130.

Thus, when the multi-path transistor 100 is on, depending on the voltage on the signal line 130, it will conduct on the second conduction path 190 or a combination of the second conduction path 190 and the first conduction path 180. The overall drain current may decrease in cases where the first conduction path 180 is cut off, but the multi-path transistor 100 will still provide adequate current $I_{ds}$ such that there is no substantial voltage drop from drain 110D to source 110S.

Figure 3A:
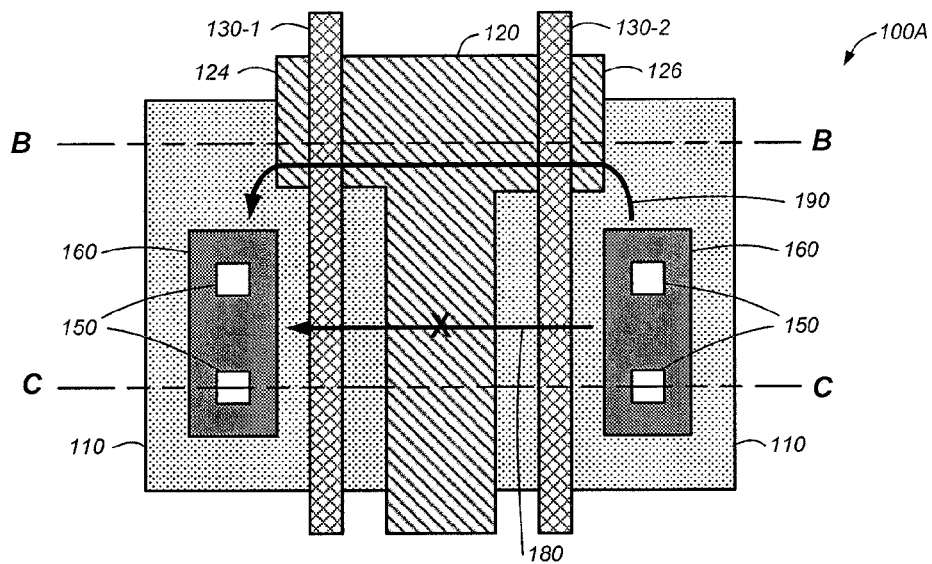
FIG. 3A is a layout diagram of multiple signal lines and a FET according to one or more embodiments of the present invention showing a gate with two gate extensions.
Figure 3B:
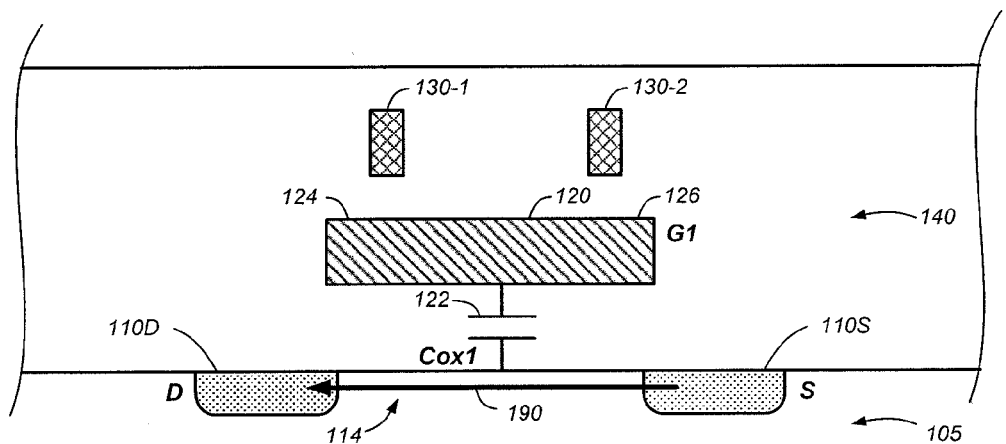
FIG. 3B is a cross-sectional view of the FET and signal lines of FIG. 3A along section line B-B.
Figure 3C:
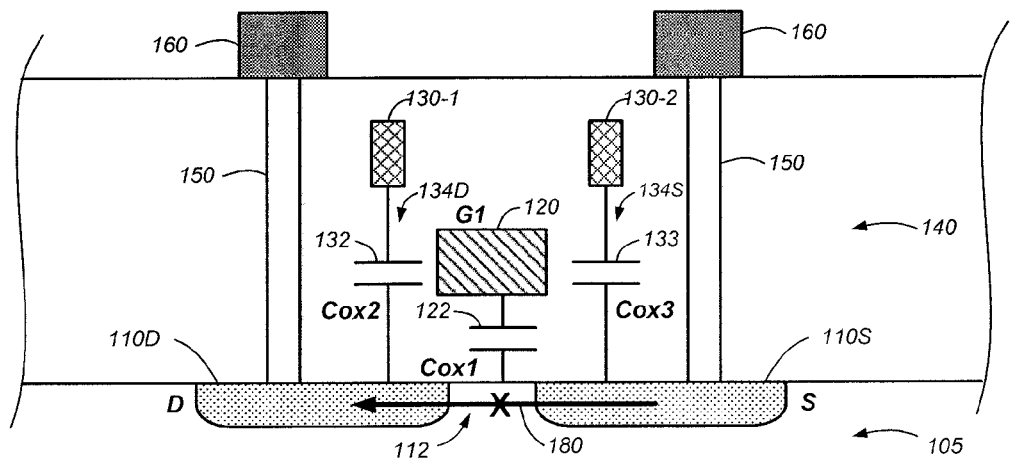
FIG. 3C is another cross-sectional view of the FET and signal lines of FIG. 3A along section line C-C.

FIG. 3A is a layout diagram of multiple signal lines (130-1 and 130-2) and a multi-path transistor 100A showing a gate 120 with two gate extensions (124 and 126). FIG. 3B is a cross-sectional view of the multi-path transistor 100A and signal lines (130-1 and 130-2) of FIG. 3A along section line B-B. FIG. 3C is another cross-sectional view of the multi-path transistor 100A and signal lines (130-1 and 130-2) of FIG. 3A along section line C-C.

The embodiment of FIGS. 3A-3C is similar to that of FIGS. 2A-2C except that a second gate extension 126 and a second signal line 130-2 with a third capacitive coupling 133 to the source 110S are included. Thus, only the differences between the embodiment of FIGS. 3A-3C and the embodiment of FIGS. 2A-2C are discussed.

The first signal line 130-1 (may also be referred to as a drain-overlap signal line) defines a drain-overlap region 134D over the drain 110D. The multi-path transistor 100A includes a first gate extension 124 which is formed as a part of the gate 120 and occupies a portion of the drain-overlap region 134D. The first gate extension 124 is insulatively disposed between, and dielectrically separated from, the first signal line 130-1 and an extension-channel region 114 (e.g., due to the one or more layers of dielectric material 140).

The second signal line 130-2 (may also be referred to as a source-overlap signal line) defines a source-overlap region 134S over the source 110S. The multi-path transistor 100A includes a second gate extension 126 which is formed as a part of the gate 120 and occupies a portion of the source-overlap region 134S. The second gate extension 126 is disposed between, and dielectrically separated from, the second signal line 130-2 and the extension-channel region 114 (e.g., due to the one or more layers of dielectric material 140).

The second signal line 130-2 with its third capacitive coupling 133 can operate in a manner similar to that discussed above for the second capacitive coupling 132 to impede the first conduction path 180. However, the second gate extension 126 can operate in a manner similar to the first gate extension 124 to break the third capacitive coupling 133 in a region below the second gate extension 126. Thus, the extension-channel region 114 between the source 110S and the drain 110D is formed under the gate 120 and gate extensions (124 and 126) to create the second conduction path 190.

As a result, the first conduction path 180 may be impeded due to certain voltages on the first signal line 130-1 or the second signal line 130-2. However, because of the first gate extension 124 and the second gate extension 126, the second conduction path 190 will conduct substantially independent from the voltage on the signal lines (130-1 and 130-2) and with enough current $I_{ds}$ such that there is no substantial voltage drop from drain 110D to source 110S.

FIGS. 4-7 show examples of other embodiments of multi-path transistors and signal lines. The function and structure of these embodiments are similar enough to those of FIGS. 2A-3C that the cross-sectional views are not shown and only functional and structural differences are described.

Figure 4:
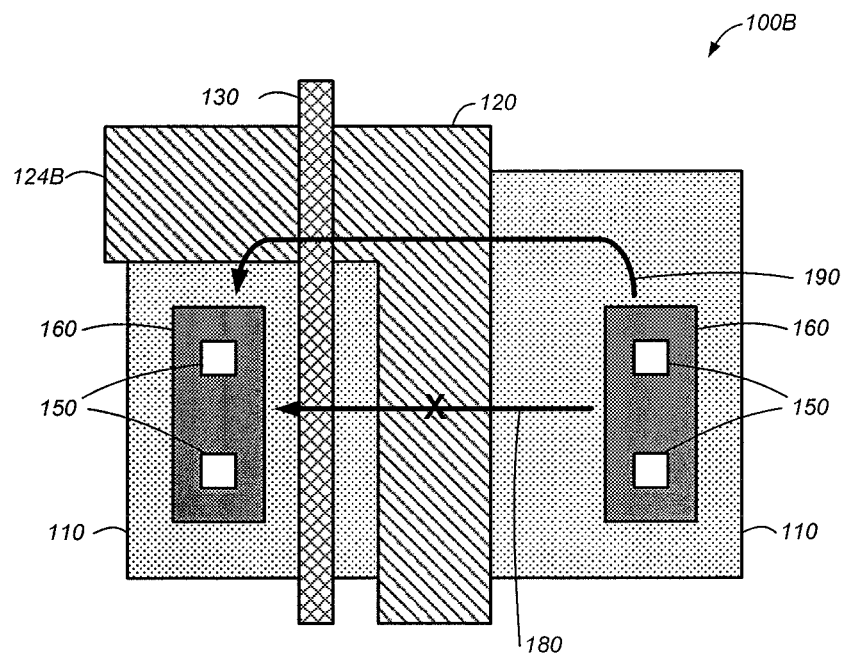
FIG. 4 is a layout diagram of a signal line and a FET according to one or more embodiments of the present invention showing a gate with a gate extension that overlaps multiple edges of an active region.

FIG. 4 is a layout diagram of a signal line 130 and a multi-path transistor 100B with a gate 120 having a gate extension 124B that overlaps multiple edges of the active region 110. The multi-path transistor 100B of FIG. 4 is similar to that of FIGS. 2A-2C except that the gate extension 124B extends beyond left edge of the active region. This gate extension 124B may be useful for creating more gate-diffusion edge between the gate extension 124B and the impurity region 110 to enable more current flow for the second conduction path 190. In addition. The longer gate extension 124B may allow for shielding of additional signal lines (not shown).

Figure 5:
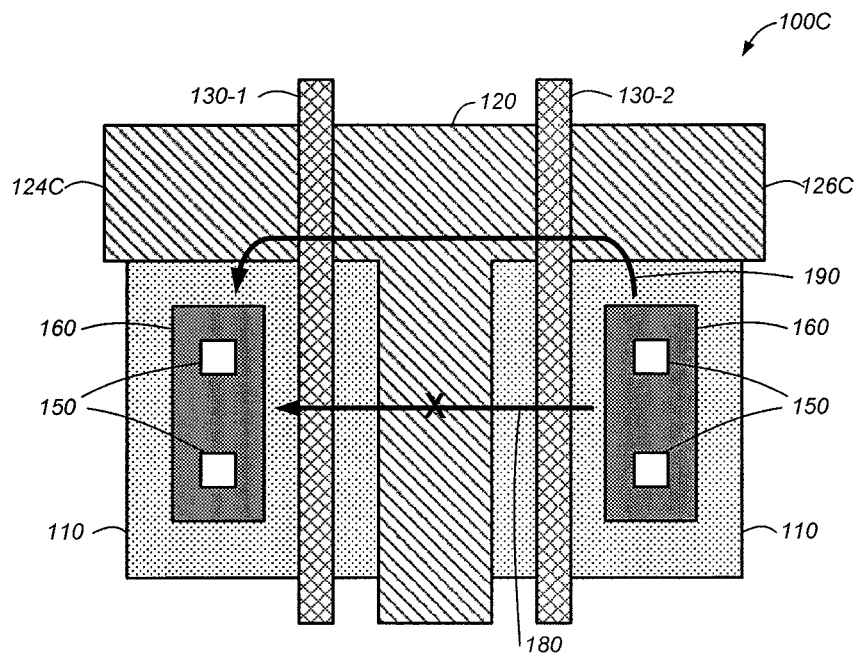
FIG. 5 is a layout diagram of a signal line and a FET according to one or more embodiments of the present invention showing a gate and two gate extensions that overlap multiple edges of an active region.

FIG. 5 is a layout diagram of multiple signal lines (130-1 and 130-2) and a multi-path transistor 100C with a gate 120 having two gate extensions (124C and 126C) that overlap multiple edges of the active region 110. The multi-path transistor 100C of FIG. 5 is similar to that of FIGS. 3A-3C except that the first gate extension 124C extends beyond the left edge of the active region and the second gate extension 126C extends beyond the right edge of the active region. These gate extensions (124C and 126C) may be useful for creating more gate-diffusion edge between the gate extensions (124C and 126C) and the impurity regions 110 to enable more current flow for the second conduction path 190. In addition, the longer gate extensions (124C and 126C) may allow for shielding of additional signal lines (not shown).

Figure 6:
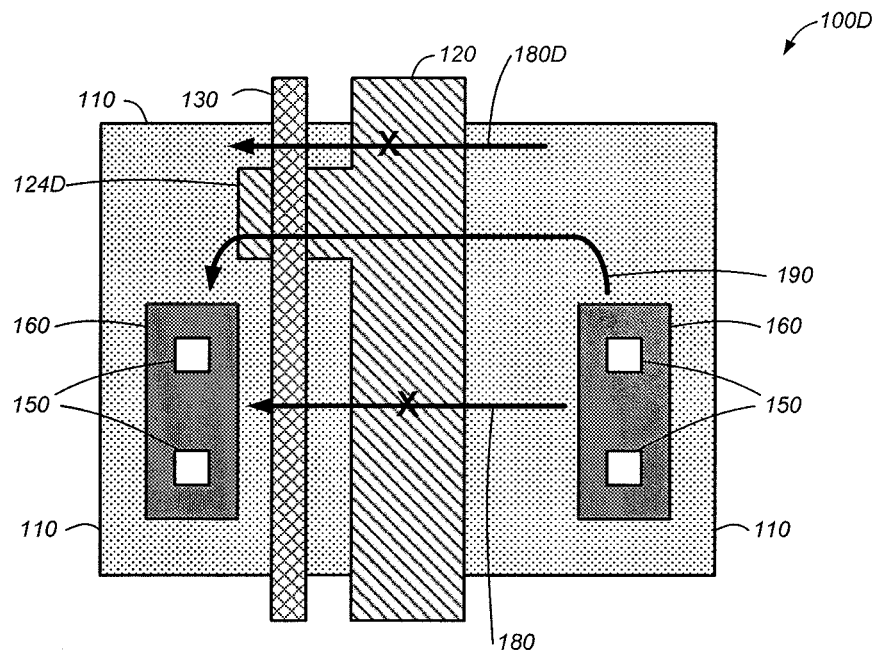
FIG. 6 is a layout diagram of a signal line and a FET according to one or more embodiments of the present invention showing a gate with a gate extension within a boundary of an active region.

FIG. 6 is a layout diagram of a signal line 130 and a multi-path transistor 100D with a gate 120 having a gate extension 124D within a boundary of the active region 110. The multi-path transistor 100D of FIG. 6 is similar to that of FIGS. 2A-2C except that the gate extension 124D does not extend beyond any edge of the active region 110 on the top. This smaller gate extension 124D may be useful for reducing gate capacitance while still enabling sufficient current flow for the second conduction path 190. However, a third conduction path 180D may be created with characteristics and operation similar to that of the first conduction path 180.

Figure 7:
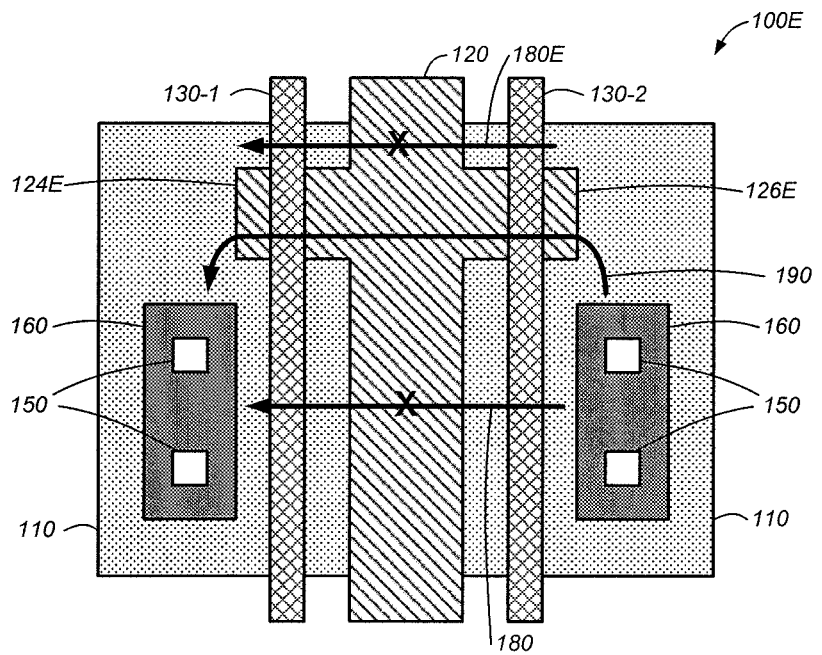
FIG. 7 is a layout diagram of a signal line and a FET according to one or more embodiments of the present invention showing a gate with two gate extensions within a boundary of an active region.

FIG. 7 is a layout diagram of multiple signal lines (130-1 and 130-2) and a multi-path transistor 100E with a gate 120 having two gate extensions (124E and 126E) within the boundary of the active regions 110. The multi-path transistor 100E of FIG. 7 is similar to that of FIGS. 3A-3C except that the gate extensions (124E and 126E) do not extend beyond any edge of the active region. These smaller gate extensions (124E and 126E) may be useful for reducing gate capacitance while still enabling sufficient current flow for the second conduction path 190. However, a third conduction path 180E may be created with characteristics and operation similar to that of the first conduction path 180.

Figure 8A:
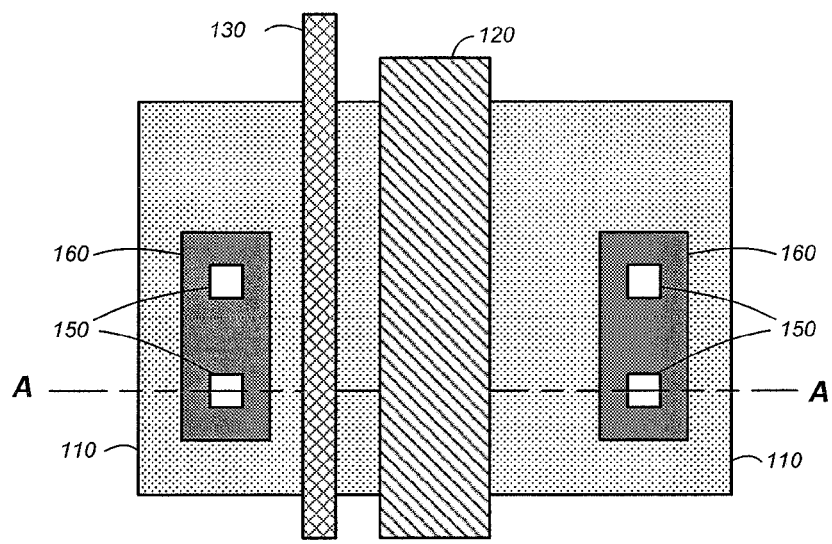
FIG. 8A is a layout diagram of a conventional Field-Effect Transistor (FET) and a signal line.
Figure 8B:
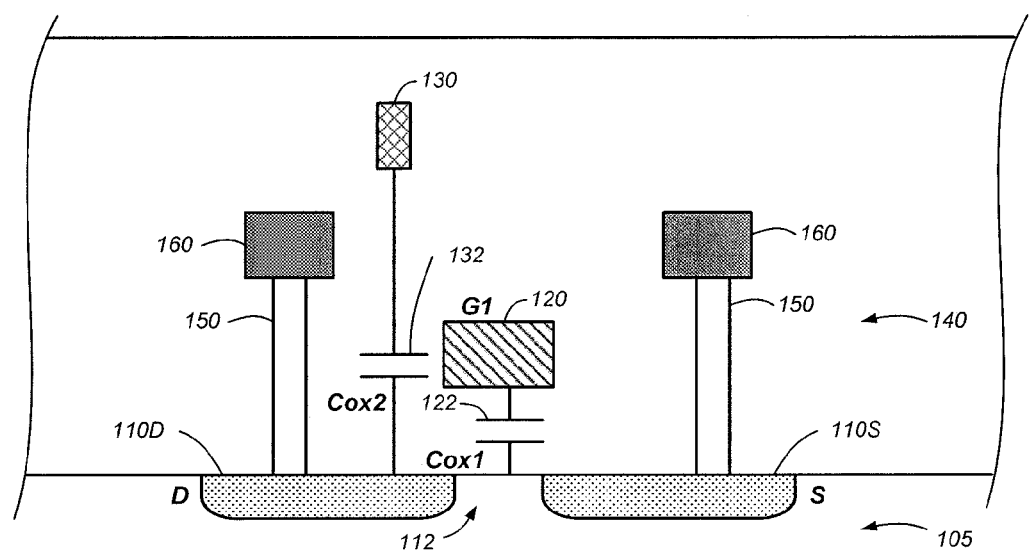
FIG. 8B is a cross-sectional view of the FET and signal line of FIG. 8A along section line A-A.
Figure 9A:
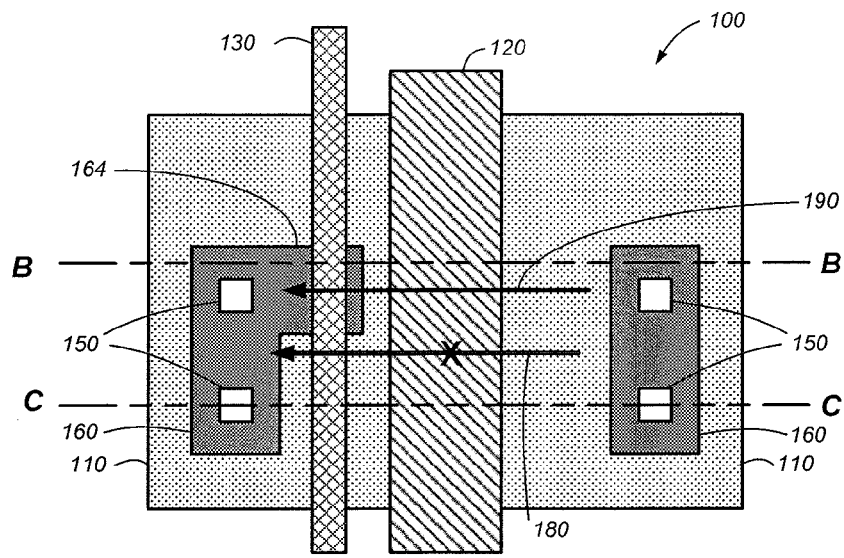
FIG. 9A is a layout diagram of a signal line and FET according to one or more embodiments of the present invention showing a conductive shield under the signal line.
Figure 9B:
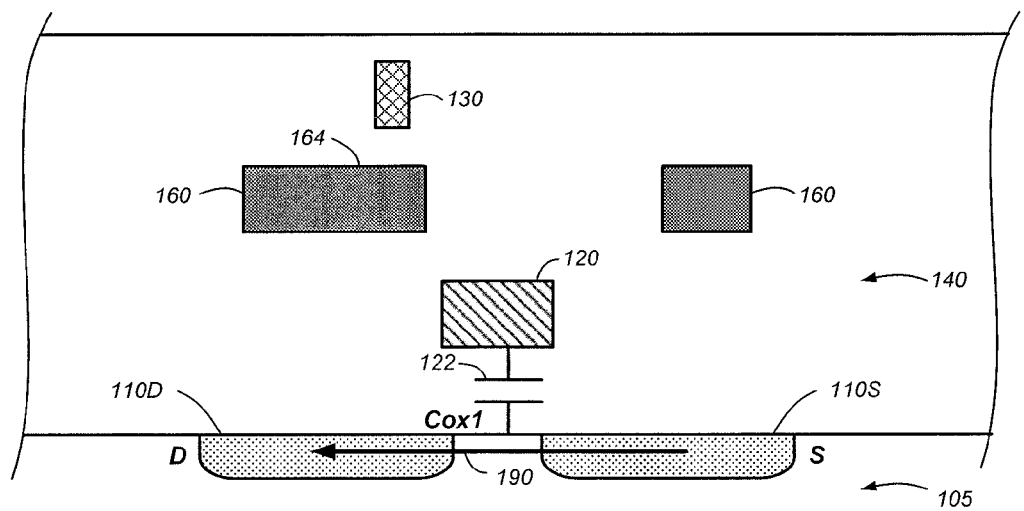
FIG. 9B is a cross-sectional view of the FET and signal line of FIG. 9A along section line B-B.
Figure 9C:
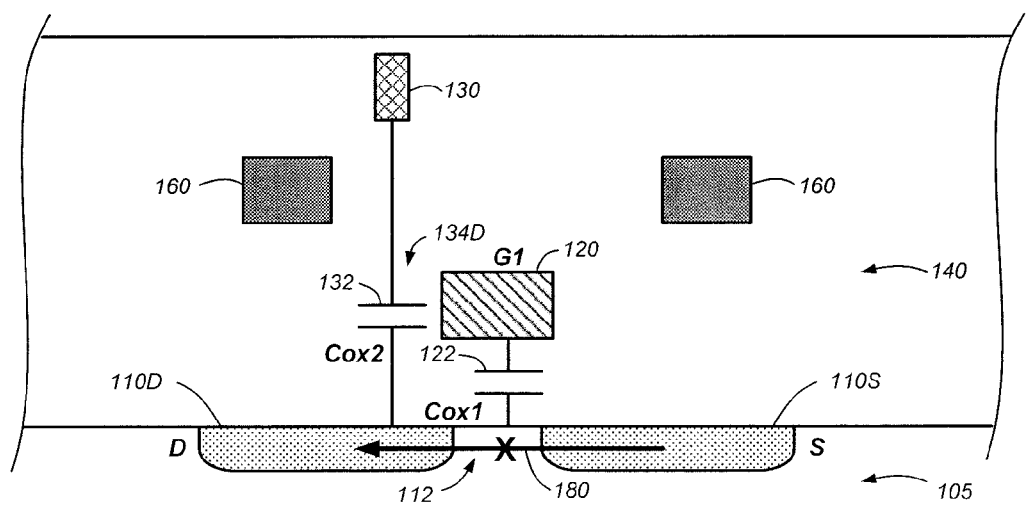
FIG. 9C is another cross-sectional view of the FET and signal line of FIG. 9A along section line C-C.

FIGS. 8A and 8B substantially repeat the information of FIGS. 1A and 1B and are shown again here to reference another embodiment of the invention described with respect to FIGS. 9A-9C.

FIG. 9A is a layout diagram of a signal line 130 and FET according to one or more embodiments of the present invention showing a conductive shield 164 (may also be referred to herein as a signal routing extension 164) under the signal line 130. FIG. 9B is a cross-sectional view of the FET and signal line 130 of FIG. 9A along section line B-B. FIG. 9C is another cross-sectional view of the FET and signal line 130 of FIG. 9A along section line C-C. In FIGS. 9A-9C, the conductive shield 164 may be an extension of the signal routing 160 connected to the drain 110D. While not illustrated, a person of ordinary skill in the art will recognize that the conductive shield 164 may also be an extension of the signal routing 160 connected to the source 110S.

The multi-path transistor 100 of FIGS. 9A-9C is similar to the multi-path transistor 100 of FIGS. 2A-2C except that the multi-path transistor 100 includes the signal routing extension 164 between a portion of the signal line 130 and a portion of the drain 110D as part of the gate 120.

The multi-path transistor 100 may be formed in or over a substrate 105 and includes a source 110S, a drain 110D, a gate 120, and a channel 112 under the gate 120 and between the source 110S and the drain 110D. The source 1105 may also be referred to herein as a source region 110S, a source portion 110S, or a source side 110S. Similarly, the drain 110D may also be referred to herein as a drain region 110D, a drain portion 110D, or a drain side 110D. In addition, the source region 110S and drain region 110D may be referred to generically as impurity regions 110 and the area encompassing the source region 110S, the drain region 110D, and the channel 112 may be referred to as an active region 110. In the drawings, the drain is also designated with "D," the source is also designated with "S," and the gate is also designated with "G1."

A capacitive coupling 122 (also designated as Cox1 in the drawings) exists between the gate 120 and the channel 112 (with at least a portion of the dielectric material 140 therebetween). In addition, a second capacitive coupling 132 (also designated as Cox2 in the drawings) exists between the signal line 130 and the drain 110D (with at least a portion of the dielectric material 140 therebetween). The signal line 130 generally carries a signal that is unrelated to the operation of the multi-path transistor 100.

Of course, the multi-path transistor 100 may be formed as a p-channel device or as an n-channel device using conventional processing methods and conventional impurity dopants for forming the impurity regions 110 of the source 110S and the drain 110D. Without limiting, and for convenience of discussion, for the most part the multi-path transistors 100 discussed herein will be described as n-channel devices. A person of ordinary skill in the art will be able to translate the discussion of structure and operation of an n-channel device to a p-channel device.

The multi-path transistor 100 also includes a conductive shield 164 which may be formed as a part of the signal routing 160 and extends underneath a portion of the signal line 130. The area between the signal line 130 and the drain 110D is referred to herein as a drain-overlap region 134D. Thus, the conductive shield 164 occupies a portion of this drain-overlap region 134D and is dielectrically disposed between, and dielectrically separated from, the signal line 130 and the drain 110D.

FIG. 9B is a cross-sectional view of the multi-path transistor 100 and the signal line 130 along section line B-B through the conductive shield 164. For the portion of the drain-overlap region 134D occupied by the conductive shield 164, the second capacitive coupling 132 is substantially broken. As a result, two different conduction paths are formed for the multi-path transistor 100. A first conduction path 180 exists where there is no conductive shield 164 and behaves as described above for FIGS. 9A and 9B. A second conduction path 190 is formed in between the source 110S and the drain 110D under the conductive shield 164.

On the second conduction path 190, the second capacitive coupling 132 is substantially broken so voltage changes on the signal line 130 are substantially shielded from the drain 110D and will have minimal effect on the second conduction path 190. Thus, the second conduction path 190 portion of the multi-path transistor 100 conducts with proper values for gate-to-source voltages, gate-to-drain voltages, and source-to-drain voltages in a normal manner substantially independent from the voltage on the signal line 130.

Thus, when the multi-path transistor 100 is on, depending on the voltage on the signal line 130, it will conduct on the second conduction path 190 or a combination of the second conduction path 190 and the first conduction path 180. The overall drain current may decrease in cases where the first conduction path 180 is cut off, but the multi-path transistor 100 will still provide adequate current $I_{ds}$ such that there is no substantial voltage drop from drain 110D to source 110S.

FIGS. 10A-11B show various fabrication stages of arrayed devices to indicate the enhanced routing capabilities of the multi-path transistors relative to conventional transistors. For simplicity, in these drawings vias have been omitted. In addition, in order to not obscure the drawings in unnecessary detail, some like elements are not indicated with an element number designator and the elements should be clear to a person of ordinary skill in the art due to the arrayed nature of these figures.

FIGS. 10A and 10B are layout diagrams of arrayed devices showing possible signal line routing over conventional FETs. FIGS. 11A and 11B are layout diagrams of arrayed devices showing possible signal line routing over multi-path transistors according to one or more embodiments of the present invention.

FIG. 10B illustrates four conventional FETs with gates 120, sources 110S on the top and bottom, and shared drains 110D in the middle. Signal routing 160 is shown for signal connections to the sources 110S and drains 110D. FIG. 10A illustrates the four conventional FETs of FIG. 10B with eight signal lines 135 routed over the gates 120. Since these signal lines 135 are routed over the gates 120, a capacitive coupling between the signal lines 135 and the underlying active region is shielded by the gates 120 and, as a result, will not adversely affect operation of the FETs.

FIG. 11B illustrates four multi-path transistors in an array 200 with gates 120, including first gate extensions 124, second gate extensions 126, sources 110S on the top and bottom, and shared drains 110D in the middle. Signal routing 160 is shown for signal connections to the sources 110S and drains 110D. FIG. 11A illustrates the four multi-path transistors of FIG. 11B with eight signal lines 135 routed over the gates 120. Since these signal lines 135 are routed over the gates 120, a capacitive coupling between the signal lines 135 and the underlying active region is shielded by the gates 120 and, as a result, will not adversely affect operation of the FETs.

In addition, FIG. 11A illustrates three drain-overlap signal lines 130-1 over the drain regions 110D and first gate extensions 124 and three source-overlap signal lines 130-2 over the source regions 110S and second gate extensions 126. This combination of signal lines (130-1, 130-2) over impurity regions 110 and gate extensions 124 operates as discussed previously to enable an alternate conduction path for the multi-path transistors.

As can be seen when comparing FIG. 11A to FIG. 10A, in this example, the multi-path transistors enable routing of a total 14 signal lines in the same space as the six signal lines possible with conventional FETs.

Figure 12:
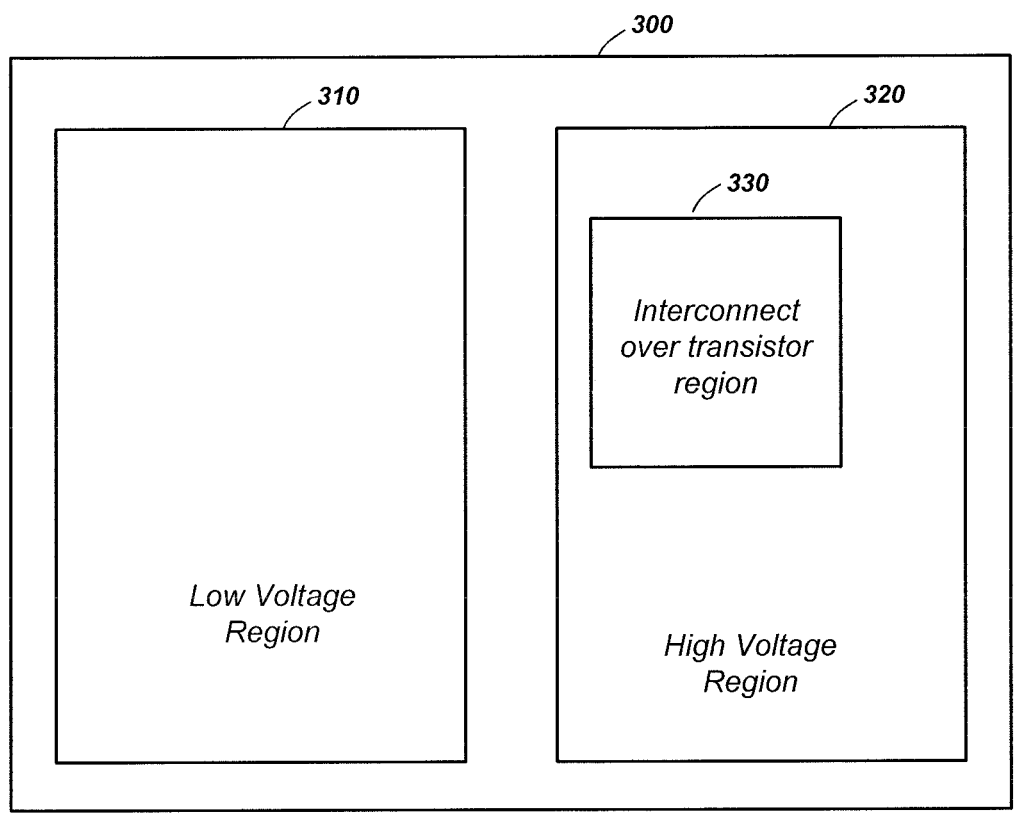
FIG. 12 is a simplified layout diagram of a semiconductor device showing various functional regions.

FIG. 12 is a simplified layout diagram of a semiconductor device 300 showing various functional regions. As mentioned previously, a semiconductor device 300 will often combine high-voltage transistors and low-voltage transistors on a single device. Thus, the semiconductor device 300 includes a low voltage region 310 for low voltage transistors that will generally have a first gate oxide thickness and first doping concentrations for the impurity regions that are suitable for low-voltage transistor operation.

The semiconductor device 300 also includes a high voltage region 320 for high voltage transistors that will generally have a second gate oxide thickness and second doping concentrations for the impurity regions that are suitable for high-voltage transistor operation.

As a non-limiting example, the high-voltage transistors may have a thicker gate oxide relative to the low-voltage transistors. In addition, the high-voltage transistors may have lighter doped impurity regions relative to the low-voltage transistors.

A high signal line density region 330 with multi-path transistors such as those previously described may be placed within the high voltage region 320. Examples for such regions include memories such as Flash memory, DRAM, SRAM, Magnetic RAM, Phase change RAM, and power devices such as DC-DC converters. The high signal line density region 330 may include a layout similar to, for example and not limitation, the layout illustrated in FIG. 9.

Conclusion

Embodiments of the present invention may include methods and devices that use shielding between signal lines and active regions to improve signal routing options over active regions of a semiconductor device.

In some embodiments, the semiconductor devices include a multi-path transistor that includes an active region comprising a channel region and an impurity region. A gate of the multi-path transistor is dielectrically separated from the channel region. A signal line is dielectrically separated from the impurity region. A conductive shield is disposed between, and dielectrically separated from, the signal line and the channel region. The channel region comprises an extension-channel region under the conductive shield and the multi-path transistor is configured to have a plurality of different conduction paths, at least one of the different conduction paths being in the extension-channel region to conduct substantially independent of a voltage on the signal line.

In other embodiments, the semiconductor devices include a multi-path transistor that includes an active region comprising a channel region and an impurity region. A gate of the multi-path transistor is dielectrically separated from the channel region. A signal line is dielectrically separated from the impurity region. A conductive shield is disposed between, and dielectrically separated from, the signal line and the impurity region. The conductive shield is operably coupled to the impurity region and the multi-path transistor is configured to have a plurality of different conduction paths, at least one of the different conduction paths being under the conductive shield to conduct substantially independent of a voltage on the signal line.

Although the present invention has been described with reference to particular embodiments, the present invention is not limited to these described embodiments. Rather, the present invention is limited only by the appended claims and their legal equivalents.

What is claimed is:

1. A semiconductor device, comprising:
   a multi-path transistor comprising a source region, a drain region, a gate and a conductive shield operably coupled to one of the source region, the drain region and the gate, wherein the multi-path transistor is configured to vary current between the source region and the drain region responsive at least to voltage changes on the gate; and
   a signal line for carrying a signal substantially unrelated to operation of the multi-path transistor, comprising:
      a first portion dielectrically separated from at least one of the source region and the drain region; and
      a second portion;
   wherein the conductive shield is disposed between, and dielectrically separated from, the second portion and the at least one of the source region and the drain region.

2. The semiconductor device of claim 1, wherein the conductive shield comprises an extension of an interconnect layer that is coupled to the at least one of the source region and the drain region.

3. The semiconductor device of claim 1, wherein the conductive shield comprises an extension of the gate.

4. The semiconductor device of claim 1, wherein the signal line comprises a plurality of signal lines.

5. The semiconductor device of claim 1, wherein the signal line comprises a first signal line and a second signal line, and the conductive shield comprises a first extension of the gate under the first signal line and a second extension of the gate under the second signal line.

6. The semiconductor device of claim 1, wherein the signal line is dielectrically separated from the at least one of the source region and the drain region by a dielectric material, the signal line being over at least a portion of the dielectric material and the at least one of the source region and the drain region.

7. The semiconductor device of claim 1, wherein the conductive shield extends underneath a portion of the signal line.

8. The semiconductor device of claim 1, wherein the conductive shield does not extend beyond an edge of the at least one of the source region and the drain region.

9. The semiconductor device of claim 1, wherein the conductive shield extends beyond an edge of the at least one of the source region and the drain region.

10. The semiconductor device of claim 1, wherein the conductive shield extends beyond multiple edges of the at least one of the source region and the drain region.

11. A semiconductor device, comprising:
    a conductive shield operably coupled to one of a source, a drain, and a gate of a multi-path transistor;
    a first conduction path comprising a channel region between the source and the drain and responsive to the gate and a first portion of a signal line dielectrically separated from the first conduction path, the signal line for carrying a variable signal substantially unrelated to operation of the multi-path transistor; and
    a second conduction path comprising another channel region between the source and the drain and responsive to the gate but substantially unresponsive to a second portion of the signal line wherein the conductive shield is disposed between, and dielectrically separated from the signal line and the second conduction path.

12. The semiconductor device of claim 11, wherein the conductive shield comprises an extension of the gate.

13. The semiconductor device of claim 11, wherein the conductive shield comprises a portion of an interconnect layer that is coupled to at least one of the source and the drain.

14. The semiconductor device of claim 11, wherein the first portion of the signal line is dielectrically separated from a region of the source.

15. The semiconductor device of claim 11, wherein the first portion of the signal line is dielectrically separated from a region of the drain.

16. The semiconductor device of claim 11, wherein the second portion of the signal line is disposed between, and dielectrically separated from the conductive shield and a region of the source.

17. The semiconductor device of claim 11, wherein the second portion of the signal line is disposed between, and dielectrically separated from the conductive shield and a region of the drain.

18. A semiconductor device, comprising:
    a conductive shield operably coupled to one of a source, a drain, and a gate of a multi-path transistor;
    a first conduction path comprising a channel region between the source and the drain and responsive to the gate and a first portion of a signal line dielectrically separated from the first conduction path; and
    a second conduction path comprising the channel region between the source and the drain and responsive to the gate but substantially unresponsive to a second portion of the signal line disposed between, and dielectrically separated from the conductive shield and the second conduction path;
    wherein:
       the signal line comprises a first signal line and a second signal line;
       the first conduction path is responsive to the gate, a first portion of the first signal line, and a first portion of the second signal line; and
       the second conduction path is responsive to the gate, but substantially unresponsive to a second portion of the first signal line and a second portion of the second signal line.

19. The semiconductor device of claim 18, wherein:
    the second portion of the first signal line is disposed between, and dielectrically separated from the conductive shield and a portion of the source; and the second portion of the second signal line is disposed between, and dielectrically separated from the conductive shield and a portion of the drain.

\* \* \* \* \*